United States Patent [19]

Göckler

[11] Patent Number: 4,792,943
[45] Date of Patent: Dec. 20, 1988

[54] DIGITAL FILTER BANK

[75] Inventor: Heinz Göckler, Backnang, Fed. Rep. of Germany

[73] Assignee: ANT Nachrichtentechnik GmbH, Backnang, Fed. Rep. of Germany

[21] Appl. No.: 29,768

[22] Filed: Mar. 24, 1987

[30] Foreign Application Priority Data

Mar. 26, 1986 [DE] Fed. Rep. of Germany ....... 3610195

[51] Int. Cl.[4] ............................................. H04J 1/02
[52] U.S. Cl. ........................................ 370/70; 370/50
[58] Field of Search ............................. 370/50, 70, 23; 364/724, 726

[56] References Cited

U.S. PATENT DOCUMENTS 4,237,551 12/1980 Narasimha ............................ 370/50
4,241,443 12/1980 Sakaki et al. ......................... 370/70
4,393,456 7/1983 Marshall, Jr. ........................ 370/70

Primary Examiner—Douglas W. Olms
Assistant Examiner—Wellington Chin
Attorney, Agent, or Firm—Spencer & Frank

[57] ABSTRACT

A circuit including a digital filter bank for effecting conversion between a frequency multiplex signal having a sampling rate $f_A$ and L product sums corresponding to the sampled values of the frequency multiplex signal, the pulse response of the filter bank being of finite length, and a discrete Fourier transformation device for effecting conversion between the product sums and L individual complex signals. The sampling rate is reduced by the factor $M \leq L$ in the transformation device so that only every $M^{th}$ value of the product sums is processed therein. In the filter bank, the frequency multiplex signal is a complex signal; the real portion and the imaginary portion of this signal are delayed in respective delay member chains associated with partial sequences of individual signal values which are sampled at a rate of $f_A/M$. These signal values for the real portion and for the imaginary portion are each multiplied by the coefficients of the pulse response and the latter are each multiplied by complex coefficients and the respective $i^{th}$ complex signals are summed to form the L product sums.

11 Claims, 9 Drawing Sheets

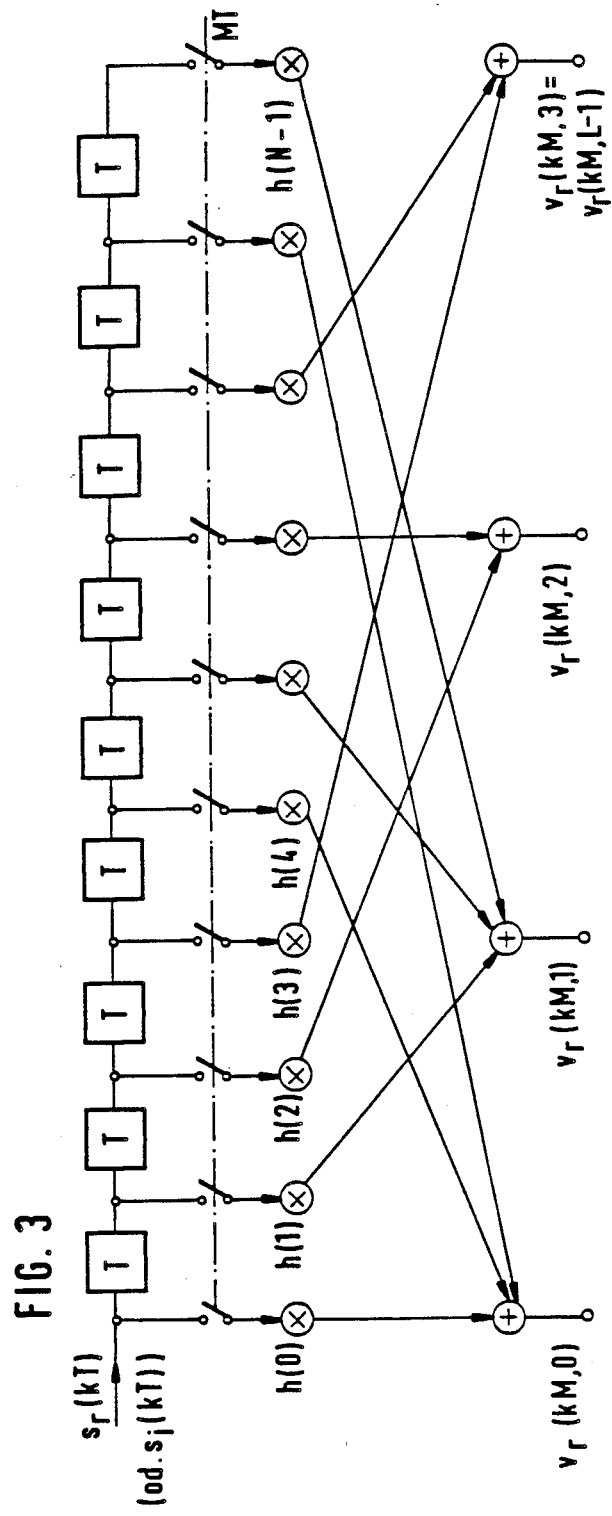

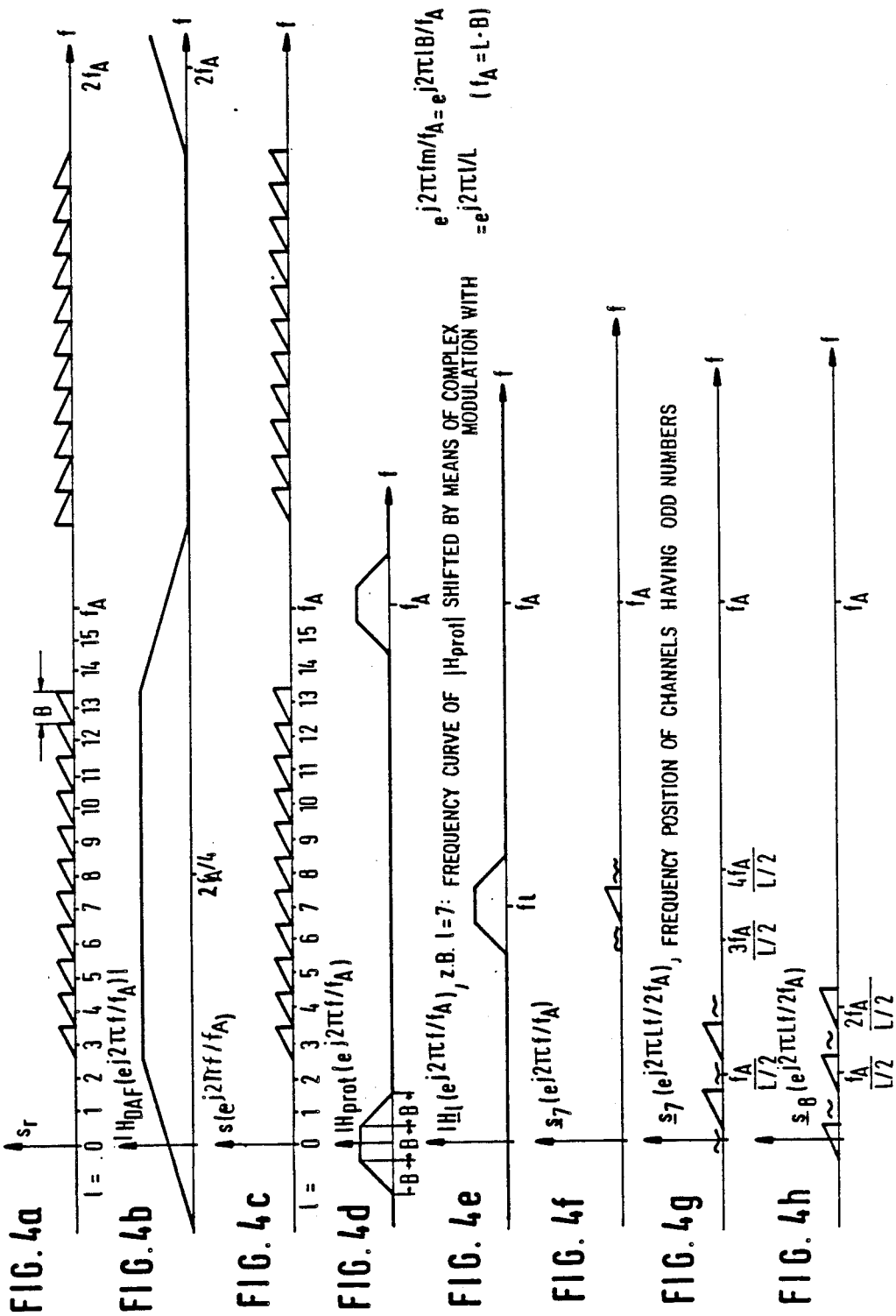

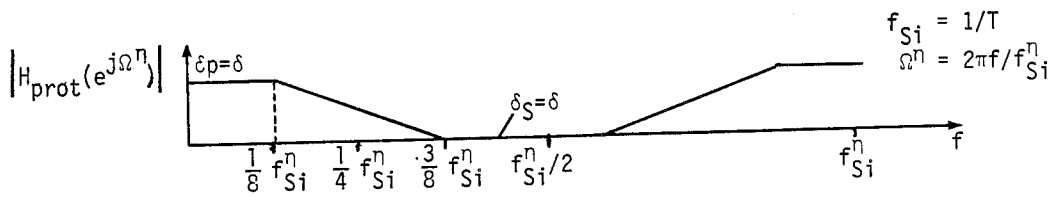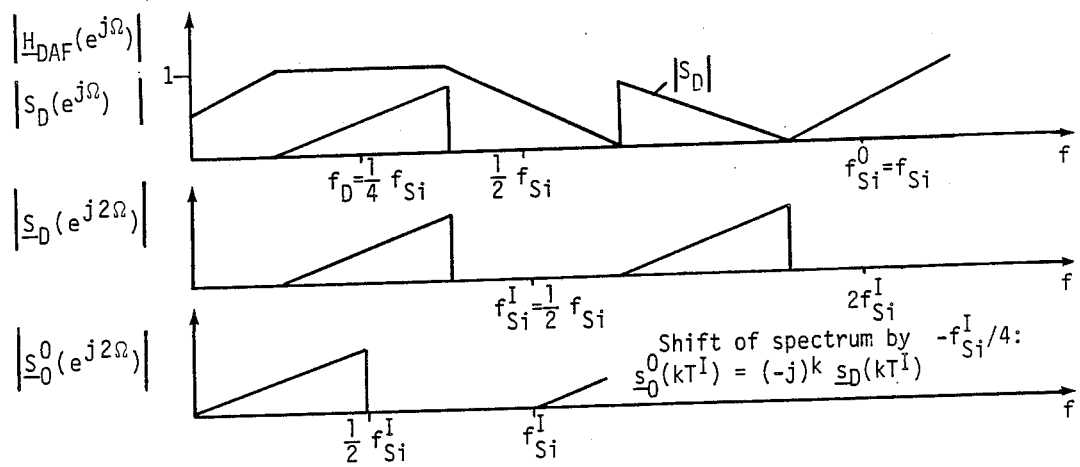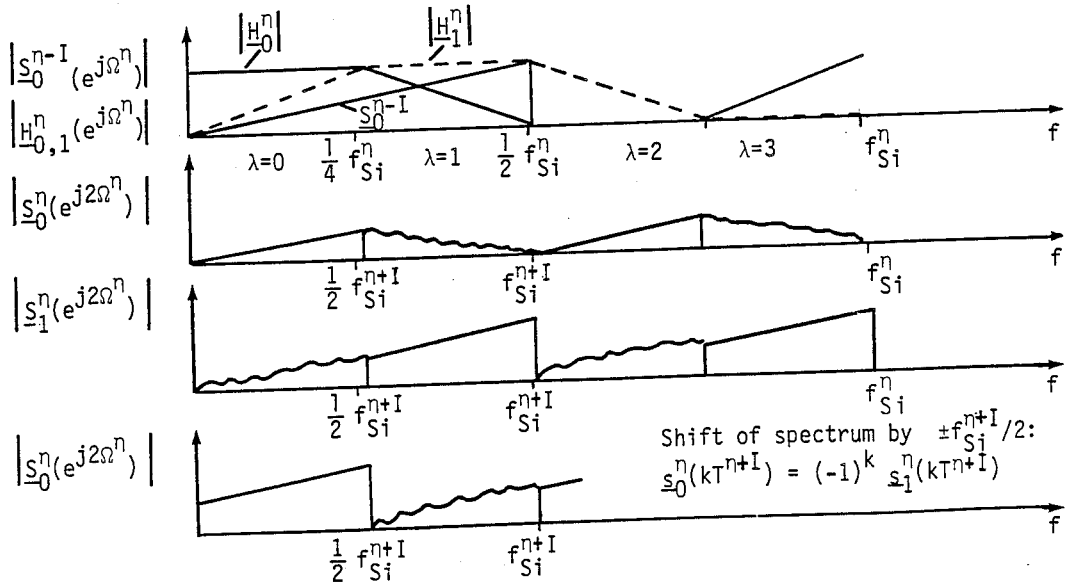
FIG. 10

DIGITAL FILTER BANK

BACKGROUND OF THE INVENTION

The present invention relates to a digital filter bank for frequency multiplex signals. Such digital filter banks are used to demultiplex and multiplex digitalized frequency multiplex signals. They are disclosed, for example, in an article of F. M. Gardnér "On-Board Processing For Mobile Satellite Communications", published in Final Report: ESTEC Contract 5889/84, Palo Alto, Calif., Gardnér Research Company, May 2, 1985, and in an article, entitled "Comprehensive Survey of Digital Transmultiplexing Methods," by Helmut Scheuermann and Heinz Göckler, in Proceedings of the IEEE 69 of November, 1981, at pages 1419-1450.

Among the drawbacks of known digital filter banks are that FFT (fast Fourier transformation) algorithms which are adapted for processing complex signals cannot be used to their best advantage.

SUMMARY OF THE INVENTION

It is therefore an object of the present invention to provide a digital filter bank of the above-mentioned type which permits optimum utilization of FFT algorithms.

The above and other objects are achieved, according to the present invention, by a circuit including a digital filter bank for effecting conversion between a frequency multiplex signal having a sampling rate $f_A$ and L product sums corresponding to the sampled values of the frequency multiplex signal, the pulse response of the filter bank being of finite length, and a discrete Fourier transformation device for effecting conversion between the product sums and L individual complex signals. The sampling rate is reduced by the factor $M \leq L$ in the transformation device so that only every $M^{th}$ value of the product sums is processed therein. In the filter bank, the frequency multiplex signal is a complex signal; the real portion and the imaginary portion of this signal are delayed in respective delay member chains associated with partial sequences of individual signal values which are sampled at a rate of $f_A/M$. These signal values for the real portion and for the imaginary portion are each multiplied by the coefficients of the pulse response and the latter are each multiplied by complex coefficients and the respective $i^{th}$ complex signals are summed to form the L product sums.

Filter banks according to the invention make possible optimum use of FFT algorithms and are very efficient, i.e. they require few adders and multipliers with respect to the intended purpose and demands for steepness, transmission and blocking ripple, etc.

The invention will now be described with reference to the drawing figures.

BRIEF DESCRIPTION OF THE DRAWING

FIG. 2 is a circuit diagram of a filter circuit including the digital filter bank of FIG. 1.

FIG. 3 is a diagram of a circuit arrangement of part of the digital filter bank of FIG. 2.

FIGS. 4a-h are diagrams of several frequency spectra generated during signal processing by the digital filter bank.

FIG. 10 represents a spectral description of the hierarchical multistage tree structure of FIG. 8.

DESCRIPTION OF THE PREFERRED EMBODIMENTS

The block in the center of FIG. 2 represents a digital filter bank Difiba. It is fed by a complex frequency multiplex signal s(kT) which, as shown by the example of FIG. 2, is generated by oversampling at a rate $2f_A$ from a frequency multiplex signal FDM and subsequent filtering by means of a digital anti-aliasing filter DAF, followed by normal sampling at a rate $f_A = 1/T$. The term k represents a time factor, $= \ldots -2, -1, 0, +1, +2 \ldots$, representative of the moment of each signal element.

The digital filter bank generates L complex signals which are then again processed, by means of a DFT (discrete Fourier transformation) or FFT processor, into L complex signals which are each demodulated on an individual channel by means of a respective demodulator Dem.

Figure 1:
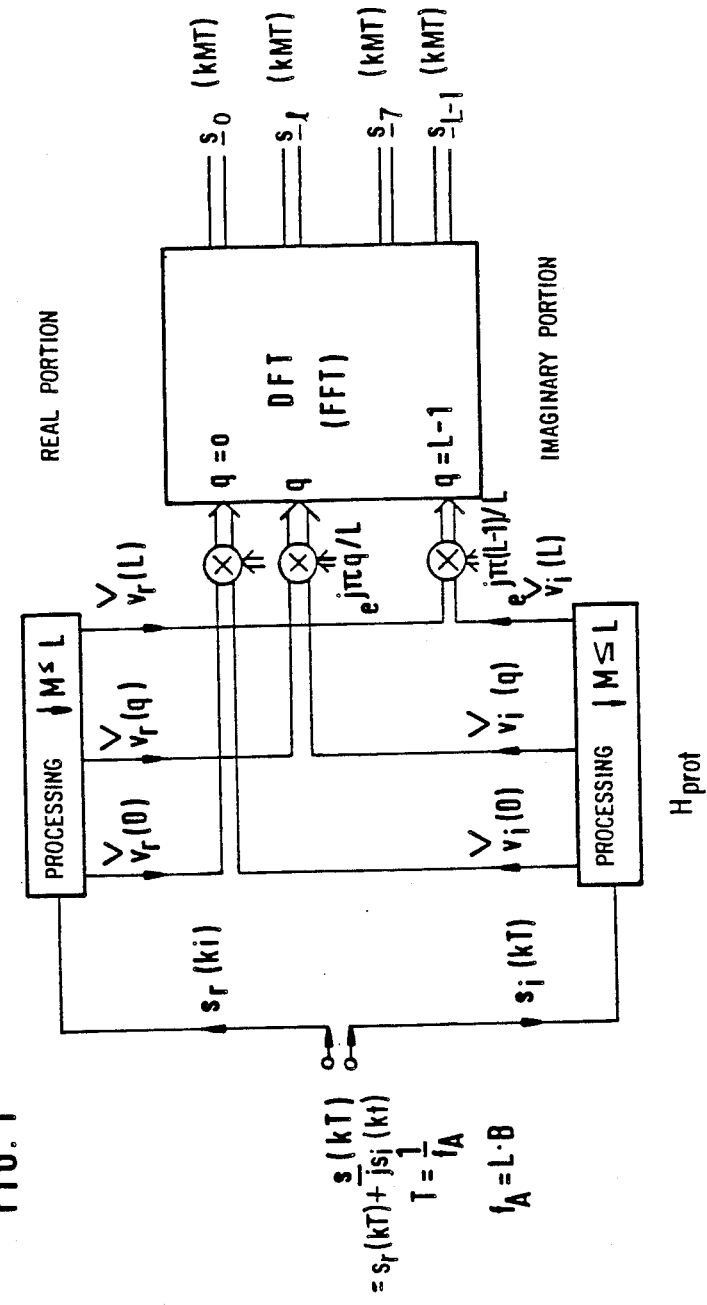
FIG. 1 is a block circuit diagram of a circuit portion including a digital filter bank according to the invention.

FIG. 1 is a block circuit diagram showing the digital filter bank composed of a block for the real portion and a block for the imaginary portion of the complex frequency multiplex signal. By processing at a low sampling rate, indicated by a perpendicularly downwardly oriented arrow, with a reduction factor $M \leq L$, these blocks generate product sums $v_r(0) \ldots v_r(L)$ from the real portion of signal s and $v_i(0) \ldots v_i(L)$ from the imaginary portion of signal s to serve as the L complex input signals for the subsequent discrete or fast Fourier transformation. This applies for channel center frequencies $f_l = l \cdot B$, where l is the consecutive channel number and B the channel bandwidth.

For channel center frequencies $f_l = l \cdot B + B/2$, the complex output signals of the two filter blocks must still be multiplied by the complex factor $e^{j\pi q/L}$, $q = 0 \ldots L-1$, before they are fed to the Fourier transformer, as shown in FIG. 1, where the L input signals to the Fourier Transformer (DFT) are distinguished by the index q and its L output signals by index l.

FIG. 3 shows a processing block of the digital filter bank of FIG. 1 composed of a chain of $N-1=9$ delay members each producing a time delay of T. The real portion $s_r(kT)$ of the complex input signal, or the imaginary portion $s_i(kT)$, enters into one end of this chain. The $N=10$ sampling values of the signal sequence are sampled at a sampling rate $1/(MT)$ and are each multiplied by a coefficient $h(0) \ldots h(N-1)$ of the pulse response of the complex filter. Since $1/T$ represents the input sampling rate of the system and $1/(MT)$ its output sampling rate, M is the decimation ratio of the system. In essence, it can be set to an arbitrary integer with $M \leq L$.

Then the products of $h(0), h(M) \ldots$ and the products of $h(1), h(1+M) \ldots$ etc. are added in selected combinations to form $L = 4$ product sums $vr(kM, 0), \ldots vr(kM, 3)$.

The filter coefficients $h(0), h(1), \ldots, h(N-1)$ are obtained with standard programs for filter synthesis, such as that described by J. H. McClellan et al.: "A computer program for designing optimum FIR linear phase digital filters", IEEE Trans. Audio Electroacoust. AU-21 (1973) 12, pp. 506–526.

The arrangement described above for the real portion is also used for the imaginary portion from which the product sums vi(kM, 0), . . . vi(kM, 3) are produced.

FIGS. 4a–h show the frequency spectra for a digital filter bank having L=16 channels of which only l=3 to 13 are being used. The channel grid is designed for center frequencies $f_l = l \cdot B + B/2$.

FIG. 4a shows the frequency spectrum $s_r$ of the frequency multiplex signals as a result of analog bandwidth limitation and oversampling at a sampling rate $2f_A$. Channels 3 to 13 are shown in the normal position in the frequency range 0 to $f_A$ and in the inverted position in the frequency range $f_A$ to $2f_A$.

FIG. 4b shows the frequency characteristic of the DAF filter of FIG. 2. It has a transmission behavior of $|H_{DAF}(e^{j2\pi f/f_A})|$ with complex coefficients and, as shown, is provided with a transmission range that is symmetrical to $f_A/2$, thus making it most economical.

FIG. 4c shows the frequency spectrum $s(e^{j2\pi f/f_A})$ of the complex signal s(kT) after periodic sampling at $f_A = 1/T$, will all channels 3 to 13 being generated in the normal position in two frequency ranges.

FIG. 4d shows the transfer function $|H_{prot}(e^{j2\pi f/f_A})|$ with a transmission range of $-B/2$ to $+B/2$ and filter transition regions each having a width B. This transmission characteristic is repeated at the multiples of sampling rate fA.

In FIG. 4e the transfer function is shifted by $f_m = l \cdot B = 7B$ as a result of complex modulation with $e^{j2\pi f f_m/f_A} = e^{j2\pi l B/f_A} = e^{j2\pi l/L}$.

The transfer function $|H_{prot}(e^{j2\pi f/f_A})|$ is the transfer function of a prototype filter, as defined in FIG. 4d, from which all other slot transfer functions of the filter bank are derivable.

FIG. 4f shows the result of filtering by means of a filter having the characteristic shown in FIG. 4e. It shows channel 7 in the normal position with vestiges of adjacent channels located at both sides due to the transition regions.

FIGS. 4g and 4h show the frequency positions of channels having an odd number $s_7(e^{j2\pi L f/2F_A})$ and an even number $s_8(e^{j2\pi L f/2f_A})$ after the sampling frequency has been reduced by the factor M=L/2.

Figure 5:
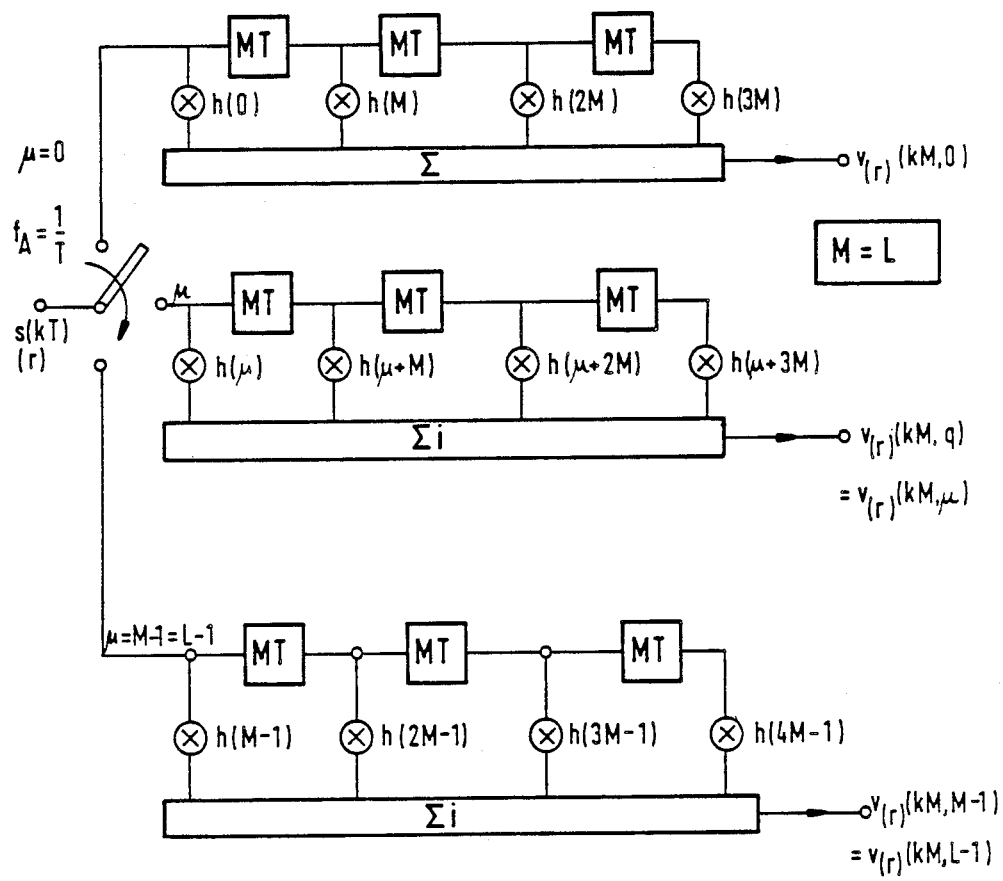
FIGS. 5, 6 and 7 are circuit diagrams of particularly favorable realizations corresponding to FIG. 3 of the digital filter bank.

FIG. 5 shows a polyphase embodiment of the digital filter bank for the special case of M=L and for channel center frequencies $f_l = l \cdot B$ or $f_l = lB + B/2$. Shown, in representative form is the processing of the real portion of the complex input signal. By means of a demultiplexer, represented by a rotating switch switching from one terminal to the next at the rate $f_A$, this succession of input signals $s_{(r)}(kT)$ is distributed at the sampling rate of $f_A = 1/T$ to M=L branches of delay members each delay member having a delay of M·T. In each one of these M branches, every $M^{th}$ value of the partial sequences is multiplied by the coefficient h(i) where $i = \mu + kM$ (for $\mu = 0, 1, \ldots M-1$ and $k = 0, 1, 2, \ldots N/M$) and is then summed to form the individual product sums $v_{(r)}(kM, \mu)$.

The decisive advantage of this arrangement is that, except for the input demultiplexer switch, all operations including storage and delay of the data is effected at the reduced output rate $f_A/M$.

Figure 6:
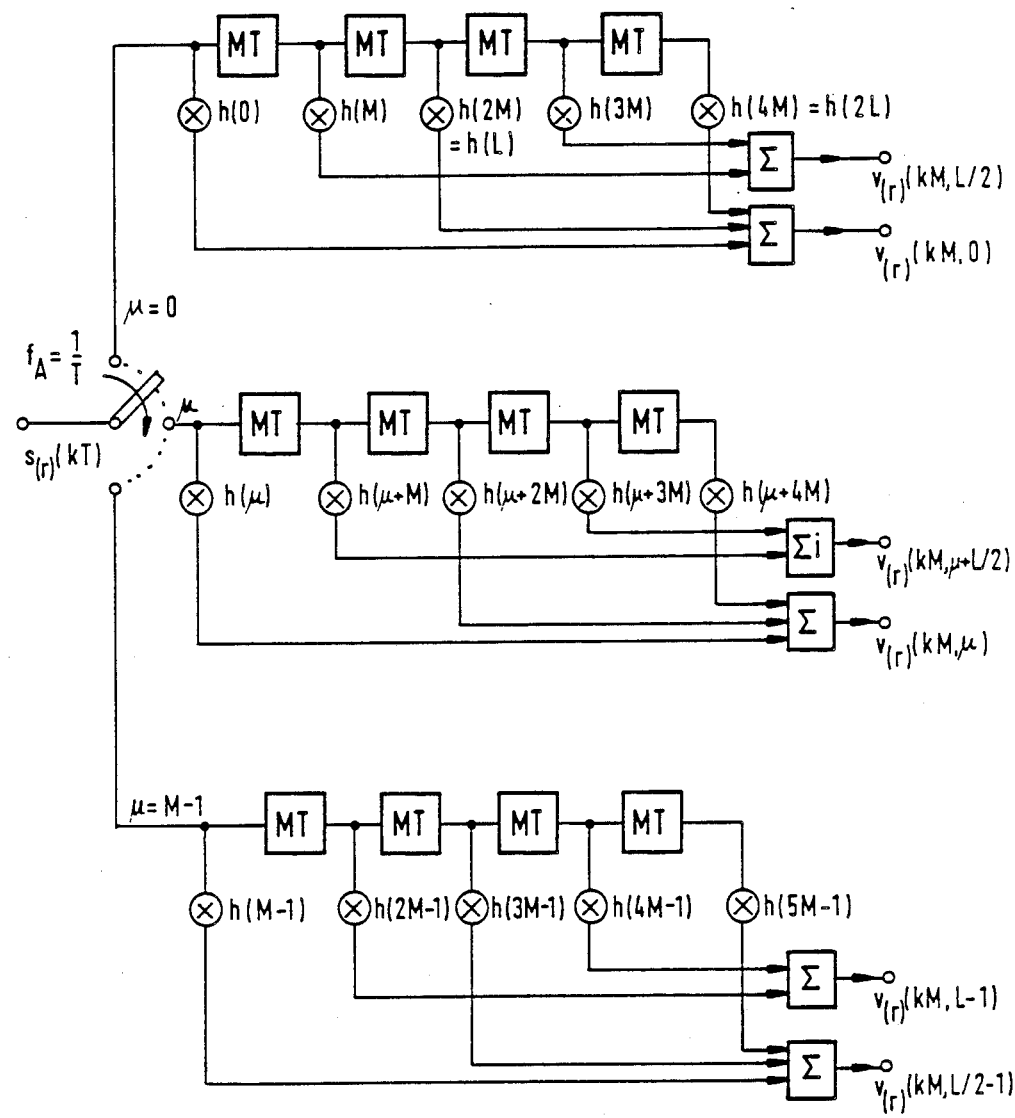

FIG. 6 shows a modified polyphase network where the filter bank according to the invention is realized by M branches, where M=L/K, and for channel center frequencies $f_l = l \cdot B$ or $f_l = lB + B/2$.

K is an integer number such that the division of the integer L by K results in an integer M.

The processing unit for the real portion $v_r(kT)$ of the complex input signal is again shown by way of example, an identical arrangement being required for the imaginary portion. The input demultiplexer switch distributes the input signal sequence at the sampling rate $f_A = 1/T$ to the $\mu$ branches each having a chain of N/M − 1 delay members. In each chain, all $K^{th}$ values of the partial sequence are combined by means of k summing members to form the signals $v_{(r)}(kM, \mu)$ to $v_{(r)}(kM, \mu + L/K)$ for $\mu = 0, 1, \ldots, M-1$.

Figure 7:
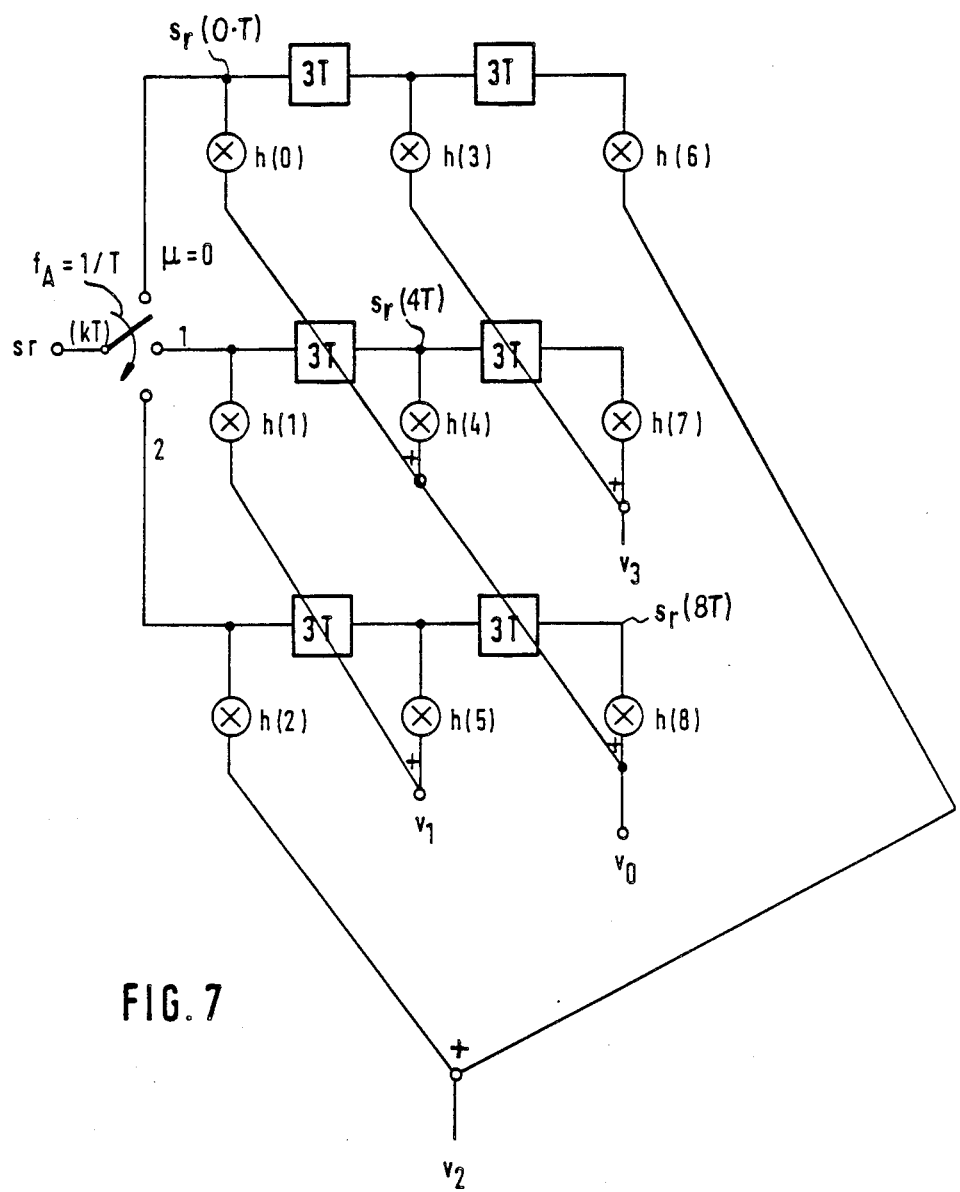

FIG. 7 shows a modified polyphase embodiment of part of the digital filter bank for the case of L=4, M=3, N=9 and for channel center frequencies $f_l = l \cdot B$ or $f_l = l \cdot B + B/2$. The processing unit for the real portion of the complex input signal is shown by way of example. The input sequence is distributed by means of a demultiplexer switch to branches $\mu = 0, 1, 2$, each including two delay members, with each delay member producing a delay of 3T. The individual values of the partial sequences are multiplied, by means of coefficients h(i) of the pulse response of the filter, with $i = 0, 1, \ldots$ to $N-1 = 8$ and the resulting products are added by means of L=4 summing members to form the product sums $v0 = h0 + h4 + h8$, $v1 = h1 + h5$, $v2 = h2 + h6$, and $v3 = h3 + h7$.

The terms h0, h1, h2, . . . , h8 are product terms. In compliance with FIG. 7 we have, for instance $h0 = s_r(0 \cdot T)h(0)$ $h4 = s_r(4T)h(4)$ $h8 = s_r(8T)h(8)$ or $v_0 = s_r(0 \cdot T)h(0) + s_r(4T)h(4) + s_r(8T)h(8)$.

Exemplary set of coefficients h(0), . . . , h(8): h(0)=h(8)=0; h(1)=h(7)=−0.111 206 7; h(2)=h(6)=0; h(3)=h(5)=0.525 138 3; h(4)=0.615 571 8.

Figure 8:
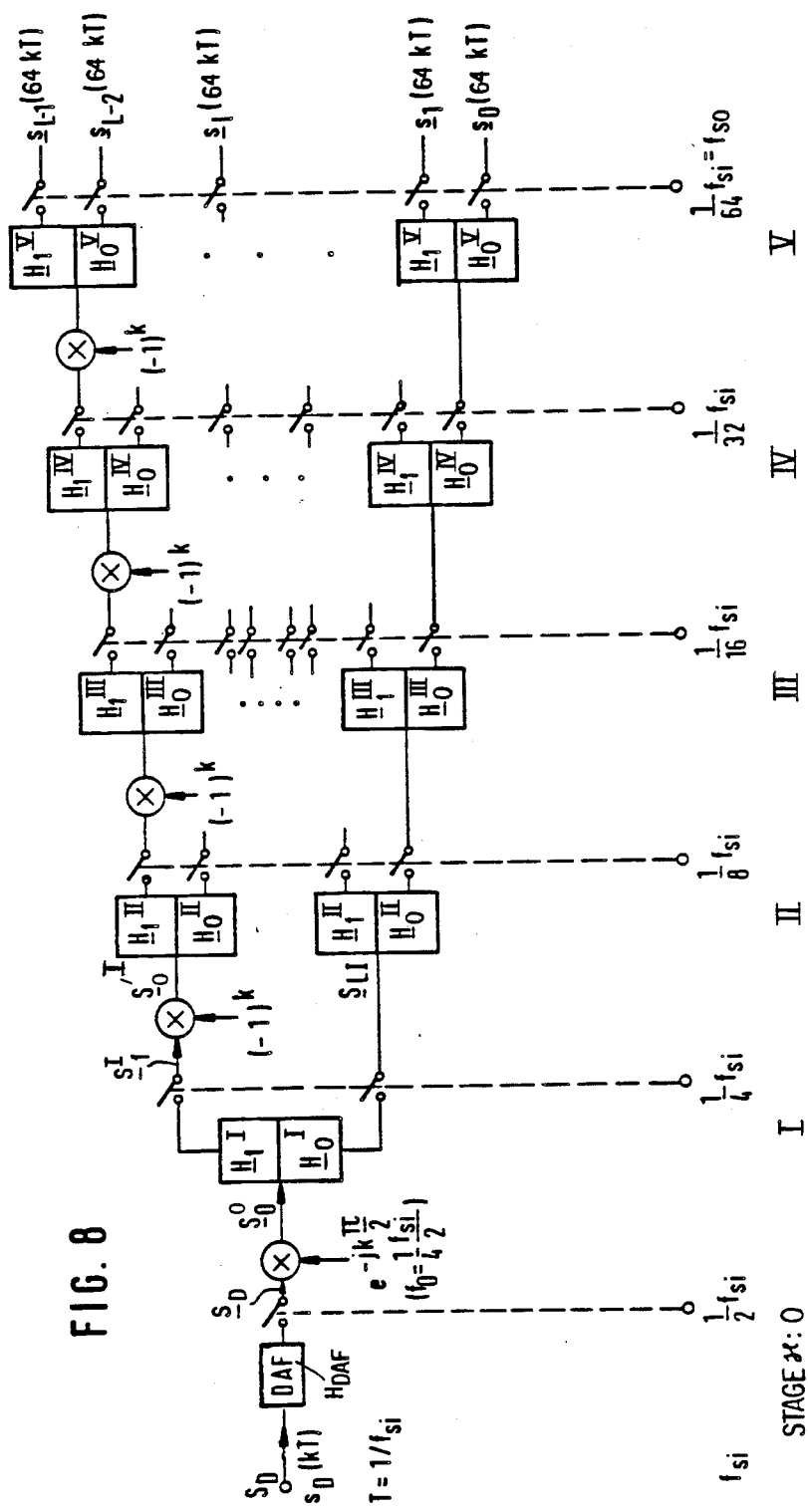
FIG. 8 is a digram of a hierarchical multistage tree structure employing a plurality of digital filter banks.

FIG. 8 shows a tree structure embodiment in which the complex input signal $S_D(kT)$ is divided into complex individual signals in stages, each stage composed of filters $\underline{H_1^p}$ and $\underline{H_0^p}$ having complex coefficients, in each stage in sampling rate being half that in the preceding stage.

The blocks of FIG. 8 termed $\underline{H_0^p}/\underline{H_1^p}$ with =I, II, III, IV, V are given by FIG. 1 with L=4 where only two output signals of each block are exploited. $\underline{H_0^p}$ represents the transfer function of a complex lowpass filter and $\underline{H_1^p}$ that of a complex bandpass filter, as defined by FIG. 10c. All these filters have complex coefficients, indicated by underlining of the respective quantities. Furthermore, FIG. 10a shows again the frequency response of the prototype filter Hprot, from which the transfer function $H_{DAF}$ of the DAF (FIG. 10b) and those of the subsequent stages $\neq 0$ (FIG. 10c) are derived (cf. FIGS. 1, 2). All terms beginning with capital S represent spectra at the input or output ports of a stage filter cell $H_0^{\nu}/H_1^{\nu}$, which are all depicted in FIG. 10.

The input sampling rate of the overall filter bank is given by $f_{si}=1/T$.

Figure 9:
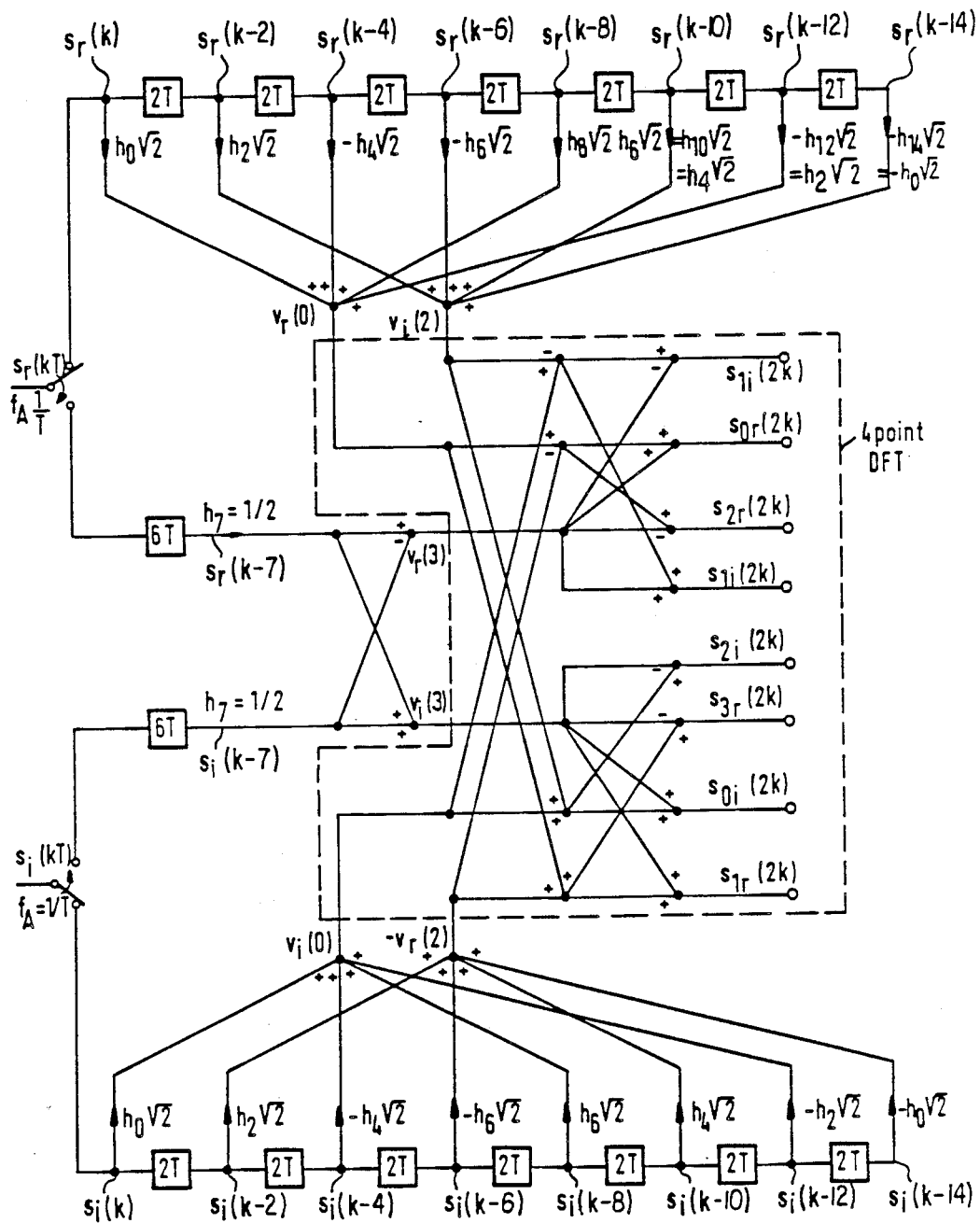
FIG. 9 is a circuit diagram of a particularly favorable optimum circuit arrangement for a digital filter bank.

FIG. 9 shows a particularly economical arrangement of a digital filter bank which additionally results in a particularly economical configuration for the subsequent DFT processor. The arrangement results for L=4, M=2, N=15 (where N=8μ−1, μ being an integer number as desired) and for channel center frequencies $f_l = l \cdot B + B/2$.

Both a real portion and an imaginary portion are shown, both having identical structures. In the real portion as well as in the imaginary portion, the complex input signal s(kT) is distributed, at the timing of the sampling frequency fA=1/T, to two chains of delay members. The first chain is composed of (N−1)/2=7 delay members each having a delay of 2T and the second chain is composed of a delay member having a delay of T(N−3)/2=6T. Since the coefficients h(i) for i=1, 3, 5, 9, 11, 13 are zero, only the output of this delay member 6T is multiplied by h7=½. The sampled values obtained at the first delay chain are multiplied by h0·√2, h2·√2, −h4·√2, −h6·√2 and, since the pulse response in this example is symmetrical, by h8·√2=h6·√2, h10·√2=h4·√2, −h12·√2=−h2·√2 and −h14·√2=−h0·√2. Then, all M=$2^{nd}$ products are summed to $v_r(0)=\sqrt{2}\cdot(h0\cdot s_r(k)-h4\cdot s_r(k-4)+h6\cdot s_r(k-8)-h2\cdot s_r(k-12))$, $v_i(0)=\sqrt{2}\cdot(h0\cdot s_i(k)-h4\cdot s_i(k-4)+h6\cdot s_i(k-8)-h2\cdot s_i(k-12))$, $-v_r(2)=\sqrt{2}[h2\cdot s_i(k-2)-h6\cdot s_i(k-6)+h4\cdot s_i(k-10)-h0\cdot s_i(k-14)]$, $v_i(2)=\sqrt{2}[h2\cdot s_r(k-2)-h6\cdot s_r(k-6)+h4\cdot s_r(k-10)-h0\cdot s_r(k-14)]$ as well as $v_r(3)=[s_r(7T)-s_i(7T)]\cdot h7$ and $v_i(3)=[s_r(7T)+s_i(7T)]\cdot h7$.

The quantities h0, h2, h4, h6 and h7 are the coefficients of the prototype filter Hprot, the frequency response of which is defined in FIG. 10a. (Filter synthesis as aforementioned).

Exemplary set of coefficients: h0=0, h2=0.018 454, h4=0.090328, h6=0.426 544, h7=0.5.

Since v(1) is identical to 0, these three complex signals v(0), v(2) and v(3) form the complex input signals for the subsequent DFT processor which needs to perform merely a few summations and subtractions:

$s_{1r}(2k)=v_r(0)-v_r(2)+v_i(3)$, $s_{0r}(2k)=v_r(0)+v_r(2)+v_r(3)$, $s_{2r}(2k)=v_r(0)+v_r(2)-v_r(3)$, $s_{3r}(2k)=v_r(0)-v_r(2)-v_i(3)$, $s_{0i}(2k)=v_i(0)+v_i(2)+v_i(3)$, $s_{1i}(2k)=v_i(0)-v_i(2)-v_r(3)$, $s_{2i}(2k)=v_i(0)+v_i(2)-v_i(3)$, and $s_{3i}(2k)=v_i(0)-v_i(2)+v_r(3)$.

In contrast to FIG. 9, if v(3)=0, μ being an integer number disappears for N=8μ+3; instead v(1)≠0. Otherwise the same relationships result.

Now follows a mathematical description of the digital filter bank for complex input and output signals.

The object is to filter out the complex input signal s(kT)=s(k) from the input spectrum of the frequency multiplex signal by means of the filter $H_l(e^{j2\pi f/fA})$, having complex coefficients.

$H_l(e^{j2\pi f/fA})$ represents the transfer function of the digital filter bank for channel l.

The pulse response (complex terms are underlined)

$$\underline{h_l(i)} = h(i)e^{j2\pi i l/L}, \quad i=0, 1, \ldots, N-1 \quad (1)$$

of the complex filter, derived by means of frequency shifting from the real prototype filter $h(i) \hat{=} H_{prot}(e^{j2\pi f/fA})$, the (complex) output signal results as a product of folding:

$$\underline{s_l(k)} = \sum_{i=-\infty}^{\infty} s(k-i) \underline{h_l(i)} \quad (2)$$

$$= \sum_{i=-\infty}^{\infty} s(k-i) h(i) e^{j2\pi i l/L}$$

The desired signal, which is related to the sampling frequency fA/M reduced by the factor M≦L, then results as follows:

$$\underline{s_l(kM)} = \sum_{i=-\infty}^{\infty} s(kM-i) h(i) e^{j2\pi i l/L} \quad (3)$$

Blocks of a length L are now formed for suitable processing where $$i = Lp+q, \text{ with } p=-\infty \ldots \infty, q=0, 1, \ldots L-1 \quad (4)$$

Entered into (3), this results in $$\underline{s_l(kM)} = \sum_{q=0}^{L-1} \sum_{p=-\infty}^{\infty} s(kM-Lp-q) h(Lp+q) e^{j2\pi(Lp+q)l/L} \quad (5)$$

The exponential term can here be simplified (p, l, L∈N) to $$e^{j2\pi(Lp+q)l/L} = e^{j2\pi pl} e^{j2\pi ql/L} = e^{j2\pi ql/L} \quad (6)$$

By abbreviating the values v(kM,q) which are identical for all channels l, there then results:

$$v(kM,q) = \sum_{p=-\infty}^{\infty} s(kM-pL-q) h(pL+q) \quad (7a)$$

$$\underline{s_l(kM)} = \sum_{q=0}^{L-1} v(kM,q) e^{j2\pi ql/L} = DFT\{v(kM,q)\} \quad (7b)$$

This is applicable for channel center frequencies $f_l = l \cdot B$.

The realization of Equations (7) is shown essentially in FIGS. 1 and 3. First it is necessary to perform processing (Equation 7a) with the sampling frequency reduced by the factor M to arrive at the complex values v(kM,q); see FIG. 3; here, the parts for calculation of the real portion are identical to those for the calculation of the imaginary portion.

The complex values v(kM,q), l=0,..., L−1 must be subjected, as a block, to a DFT of a length L. This optimally utilizes the efficiency of the DFT algorithm (or any desired FFT algorithm) since complex signals are required as input as well as output values.

It is also possible to shift the channel grid by onehalf a channel bandwidth or as desired by n/m (n, m∈N; n<m) with respect to FIG. 4, where n and m are integer numbers and n<m.

Then, instead of (1), the following applies:

$$h_l(i) = h(i) e^{j2\pi i \frac{(l+n/m)}{L}} \tag{8}$$

Then Equation (5) reads as follows:

$$s_l(kM) = \sum_{q=0}^{L-1} \sum_{p=-\infty}^{\infty} s(kM - pL - q) h(pL + q) e^{j2\pi \frac{(Lp+q)(l+n/m)}{L}} \tag{9}$$

and the exponential term (6) n, m∈N, n<m, becomes $$e^{j2\pi \frac{(Lp+q)(l+n/m)}{L}} = e^{j2\pi \frac{ql}{L}} e^{j2\pi p \frac{n}{m}} e^{j2\pi \frac{qn}{Lm}} \tag{10}$$

Thus, Equations (7) become $$v(kM,q) = \sum_{p=-\infty}^{\infty} s(kM - pL - q) h(pL + q) e^{j2\pi p \frac{n}{m}} e^{j2\pi \frac{qn}{Lm}} \tag{11a}$$

$$= \sum_{p=-\infty}^{\infty} s(kM - pL - q) \bar{h}(pL + q)$$

$$s_l(kM) = \sum_{q=0}^{L-1} v(kM,q) e^{j2\pi \frac{ql}{L}} = DFT\{v(kM,q)\} \tag{11b}$$

This also applies generally for channel center frequencies $f_l = l \cdot B + B \cdot n/m$.

The complex coefficients $$\bar{h}(pL + q) = h(pL + q) e^{j2\pi p \frac{n}{m}} e^{j2\pi \frac{qn}{Lm}} \tag{11c}$$

take the place of the originally real coefficients h(pL+q), which, for the calculation of the values $\bar{n}$(kM,q), corresponds to doubling the original number of multiplications and additions.

For m=2 and m=4, there also exists the possibility of calculating $\bar{v}$(kM,q) by way of $$v(kM,q) = \sum_{p=-\infty}^{\infty} s(kM - pL - q) h(pL + q) e^{j2\pi p \frac{n}{m}} \tag{12a}$$

where m=2 is $$e^{j2\pi p \frac{n}{2}} = (-1)^{np} \tag{12b}$$

and m=4 is $$e^{j2\pi p \frac{n}{4}} = j^{np} \tag{12c}$$

Thus the effort required to calculate v[?](kM,q) of Equation (12a) and v(kM,q) of equation (7a) is identical. Finally, this results in $$v(kM,q) = \bar{v}(kM,q) e^{j2\pi \frac{qn}{Lm}} \tag{12d}$$

which generally requires an additional four multiplications and two additions for each q=0, 1, ..., L−1, if n≠0. Compared with the effort for Equation (11), the effort for Equation (12) is always less if $$4L < 2N \tag{13}$$

which is frequently the case.

Another possibility for m=2 and m=4 is to combine the factors $$e^{j2\pi \frac{qn}{Lm}}$$

(Equation 12d) with the DFT to obtain an odd (ODFT), which results in a further reduction of effort.

It is known that any desired digital signal processing network can be converted to a dual function network by transposition. For example, a digital filter bank for the frequency separation of frequency multiplex signals can be converted, by means of the transposition method, into a filter bank for the frequency combination of individual signals into a frequency multiplex signal. For the above described structures, this means that all signal flow directions are reversed (i.e. exchange of input and output, adder becomes branching member, branching member becomes adder, DFT becomes inverse DFT). The method of transposing digital networks is described in the article entitled, "On The Transposition Of Linear Time-Varying Discrete-Time Networks And Its Application To Multirate Digital Systems", Philips J. Res., Volume 33, 1978, pages 78-102.

The invention now being fully described, it will be apparent to one of ordinary skill in the art that many changes and modifications can be made thereto without departing from the spirit or scope of the invention as set forth herein.

The present disclosure relates to the subject matter disclosed in German Application P 36 10 195.8 of March 26, 1986, the entire specification of which is incorporated herein by reference.

What is claimed is:

1. In a frequency multiplex circuit including a digital filter bank for effecting conversion between a frequency multiplexed signal and a plurality of weighted filter signals, and discrete Fourier transformation means connected to said filter bank for effecting a discrete Fourier transformation between the weighted filter signals and L individual complex signals appearing on separate lines, wherein:
   the frequency multiplexed signal contains component signals each associated with a respective individual complex signal and having a bandwidth B;
   the weighted filter signals have the form $$v(k,q) = \sum_{p=-\infty}^{+\infty} s(k-i) \cdot h(i)$$

where
i = p·L + q
q = 0, 1, 2, ... L−1, and
i, p, q = (0, 1, 2, 3, ...)
the frequency multiplexed signal is s(k) and has a sampling rate of $f_A$;
h(i) is a coefficient representing a pulse response of a finite length for i = 0, 1, 2, ... N−1;
the discrete Fourier transformation has the form $$s_l(kM) = \sum_{q=0}^{L-1} v(kM,q) \cdot e^{j2\pi ql/L} = DFT\{v(kM,q)\},$$

where $s_l(kM)$ represents the individual complex signals and DFT { } is the discrete Fourier transformation, M is a sampling rate reduction factor, M ≤ L, and the discrete Fourier transformation involves sampling with respect to every Mth value of the weighted filter signals;
each component signal of the frequency multiplexed signal is associated with a respective channel having a channel number, l, and a center channel frequency $f_l = l \cdot B$ and l = 1, 2, ... L−1, the improvement wherein:
the frequency multiplexed signal is a complex signal, $s(kT) = s_r(kT) + js_i(kT)$ with a real portion $Re = s_r(kT)$ and an imaginary portion $Im = s_i(kT)$, and k is a time factor = ..., −1, 0, +1 ...; and said filter bank comprises:
two chains of N−1 delay members each having a delay of T and each processing a respective portion of the complex signal, where N is the number of frequency multiplexed signal values associated with each set of weighted filter signal values and T = 1/$f_A$; sampling means for sampling the signals associated with each delay member at a rate corresponding to the sampling rate of the frequency multiplexed signal reduced by M; first processing means for effecting conversion between each sample signal associated with a given delay member and an associated weighted sample signal; and second processing means for effecting conversion between selected weighted filter signals and selected weighted sample signals.

2. In a frequency multiplex circuit including a digital filter bank for effecting conversion between a frequency multiplexed signal and a plurality of weighted filter signals, and discrete Fourier transformation means connected to said filter bank for effecting a discrete Fourier transformation between the weighted filter signal and L individual complex signals appearing on separate lines, wherein:
the frequency multiplexed signal contains component signals each associated with a respective individual complex signal and having a bandwidth B;
the weighted filter signals are complex signals having the form $$v(k,q) = \sum_{p=-\infty}^{+\infty} s(k-i) \cdot h(i) \cdot e^{j2\pi in/mL}$$

where
n < m,
n = 0, 1, 2, ...,
m = 1, 2, ..., i = p·L + q q = 0, 1, 2, ... L−1, and
i, p, q = (0, 1, 2, 3, ...)
the frequency multiplexed signal is s(k) and has a sampling rate of $f_A$;
h(i) is a coefficient representing a pulse response of a finite length for i = 0, 1, 2, ... N−1, which pulse response has a complex rotation factor;
the discrete Fourier transformation has the form $$s_l(kM) = \sum_{q=0}^{L-1} v(kM,q) \cdot e^{j2\pi ql/L} = DFT\{v(kM,q)\},$$

where $s_l(kM)$ represents the individual complex signals and DFT { } is the discrete Fourier transformation, M is a sampling rate reduction factor, M ≤ L, and the discrete Fourier transformation involves sampling with respect to every Mth value of the weighted filter signals;
each component signal of the frequency multiplexed signal is associated with a respective channel having a channel number, l, and a center channel frequency $f_l = l \cdot B + B \cdot n/m$ and l = 0, 1, 2, ... L−1, the improvement wherein:
the frequency multiplexed signal is a complex signal, $s(kT) = s_r(kT) + js_i(kT)$ with a real portion $Re = s_r(kT)$ and an imaginary portion $Im = s_i(kT)$, and k is a time factor = ..., −1, 0, +1 ...; and
said filter bank comprises:
two chains of N−1 delay members each having a delay of T and each processing a respective portion of the complex signal, where N is the number of frequency multiplexed signal values associated with each set of weighted filter signal values and T = 1/$f_A$; sampling means for sampling the signals associated with each delay member at a rate corresponding to the sampling rate of the frequency multiplexed signal reduced by M; first processing means for effecting conversion between each sample signal associated with a given delay member and an associated weighted sample signal, wherein each weighted sample signal corresponds to a sample signal multiplied by a complex coefficient $h(i) = h_r(i) + jh_i(i)$, where $h_r(i) = h(i) \cdot \cos(2\pi \cdot in/Lm)$ and $h_i(i) = h(i) \cdot \sin(2\pi i.n/Lm)$; and second processing means for effecting conversion between selected weighted complex filter signals v(kM,q) and respective ith weighted sample signals.

3. In a frequency multiplex circuit including a digital filter bank for effecting conversion between a frequency multiplexed signal and a plurality of weighted filter signals, and discrete Fourier transformation means connected to said filter bank for effecting a discrete Fourier transformation between the weighted filter signal and L individual complex signals appearing on separate lines, wherein:
the frequency multiplexed signal contains component signals each associated with a respective individual complex signal and having a bandwidth B;
the weighted filter signals are complex signals having the form $$v(k,q) = \sum_{p=-\infty}^{+\infty} s(k-i) \cdot h(i) \cdot e^{j\pi i/L}$$

where $i = p \cdot L + q$ $q = 0, 1, 2, \ldots L-1$, and
$i, p, q = (0, 1, 2, 3, \ldots)$
the frequency multiplexed signal is $s(k)$ and has a sampling rate of $f_A$;
$h(i)$ is a coefficient representing a pulse response of a finite length for $i = 0, 1, 2 \ldots N-1$, which pulse response has a complex rotation factor;
the discrete Fourier transformation has the form $$s_l(kM) = \sum_{q=0}^{L-1} v(kM,q) \cdot e^{j2\pi ql/L} = DFT\{v(kM,q)\},$$

where $s_p(kM)$ represents the individual complex signals and $DFT\{\ \}$ is the discrete Fourier transformation, $M$ is a sampling rate reduction factor, $M \leq L$, and the discrete Fourier transformation involves sampling with respect to every $M$th value of the weighted filter signals;
each component signal of the frequency multiplexed signal is associated with a respective channel having a channel number, $l$, and a center channel frequency $f_l = l \cdot B + B/2$ and $l = 0, 1, 2, \ldots L-1$, the improvement wherein:
the frequency multiplexed signal is a complex signal, $s(kT) = s_r(kT) + js_i(kT)$ with a real portion $Re = s_r(kT)$ and an imaginary portion $Im = s_i(kT)$, and $k$ is a time factor = $\ldots, -1, 0, +1 \ldots$; and
said filter bank comprises:
two chains of $N-1$ delay members each having a delay of $T$ and each processing a respective portion of the complex signal, where $N$ is the number of frequency multiplexed signal values associated with each set of weighted filter signal values and $T = 1/f_A$; sampling means for sampling the signals associated with each delay member at a rate corresponding to the sampling rate of the frequency multiplexed signal reduced by $M$; first processing means for effecting conversion between each sample signal associated with a given delay member and an associated weighted sample signal; second processing means for effecting conversion between selected weighted filter signals and selected weighted sample signals; and third processing means for effecting conversion between complex selected weighted filter signals and those signals multiplied by $e^{j2\pi q/L}$.

4. In a frequency multiplex circuit including a digital filter bank for effecting conversion between a frequency multiplexed signal and a plurality of weighted filter signals, and discrete Fourier transformation means connected to said filter bank for effecting a discrete Fourier transformation between the weighted filter signals and L individual complex signals appearing on separate lines, wherein:
the frequency multiplexed signal contains component signals each associated with a respective individual complex signal and having a bandwidth B;
the weighted filter signals have the form $$v(k,q) = \sum_{p=-\infty}^{+\infty} s(k-i) \cdot h(i) \cdot e^{j\pi in/mL}$$

where
$n = 0$, or $n = 1$ and $m = 2$, $i = p \cdot L + q$, $q = 0, 1, 2, \ldots L-1$, and
$i, p, q = (0, 1, 2, 3, \ldots)$
the frequency multiplexed signal is $s(k)$ and has a sampling rate of $f_A$;
$h(i)$ is a coefficient representing a pulse response of a finite length for $i = 0, 1, 2, \ldots N-1$, which pulse response has a complex rotation factor;
the discrete Fourier transformation has the form $$s_l(kM) = \sum_{q=0}^{L-1} v(kM,q) \cdot e^{j2\pi ql/L} = DFT\{v(kM,q)\},$$

where $s_l(kM)$ represents the individual complex signals and $DFT\{\ \}$ is the discrete Fourier transformation, $M$ is a sampling rate reduction factor, $M \leq L$, and the discrete Fourier transformation involves sampling with respect to every $M$th value of the weighted filter signals;
each component signal of the frequency multiplexed signal is associated with a respective channel having a channel number, $l$, and a center channel frequency $f_l = l \cdot B + B \cdot n/m$ and $l = 0, 1, 2, \ldots L-1$, the improvement wherein:
the frequency multiplexed signal is a complex signal, $s(kT) = s_r(kT) + js_i(kT)$ with a real portion $Re = s_r(kT)$ and an imaginary portion $Im = s_i(kT)$, and $k$ is a time factor = $\ldots, -1, 0, +1 \ldots$; and
said filter bank comprises two identical signal processing systems, each associated with a respective complex signal portion and each comprising:
multiposition switch means having a contact switchable between $M$ terminals and $M$ chains of delay members, each chain being connected to a respective terminal of said switch means and containing a number of delay members equal to the largest integer which is not greater than $N/M$, and each delay member producing a delay of $MT$, with the associated portion of the frequency multiplexed signal being present at said switch means contact, said switch means being operative to connect said contact cylically to each terminal in turn at the sampling rate of $f_A$ from terminal to terminal so that said contact is cyclically connected to each terminal at a rate of $f_A/M$; and
first processing means connected to said delay members for affecting conversion between each sample signal associated with a given delay member and an associated weighted product signal according to the relation $P(\mu, \nu) = s_\mu(kM - \nu M) \cdot h(\mu + \nu M)$, where
$P$ is the weighted product signal,
$\mu$ is the associated chain = $0, 1 \ldots M-1$,
$s_\mu$ is the sample signal at the associated terminal,
$\nu$ is the associated delay member = $0, 1, 2 \ldots$, and
$h$ is the weighting coefficient; and said filter bank further comprises:

second processing means connected to said first processing means of each said signal processing system for effecting conversion between the weighted product signals and L intermediate complex signals v(kM, q), each portion of each intermediate complex signal being the sum of selected weighted product signals for which $\mu = pM + p\lambda + q - \alpha M$, where $\alpha = (pM + p\lambda + q)/M$ and $\lambda = L - M$; and third processing means connected to said second processing means for effecting conversion between each intermediate complex signal and an associated weighted filter signal, such that each weighted filter signal is $$v(kM, q) \cdot e^{j\pi nq/L} \quad (=1 \text{ for } n=0).$$

5. A frequency multiplex circuit as defined in claim 4 wherein for $M = L/R$, $R \leq L$, and $R = 1, 2, 3 \ldots$, said second processing means comprises R summing members for each delay member chain, for forming R sum signals, each said summing member being connected to sum the weighted product signals $P(\mu, v)$ for which $v = bR + c$, where $b = 0, 1, 2 \ldots$, and c represents the given summing member and $= 1, 2 \ldots R$.

6. A frequency multiplex circuit as defined in claim 4 wherein, for $M = L$, said second processing means are operative, for each chain, for summing all weighted product signals $P(\mu, v) = P(q)$ to form L intermediate signals for each of the real and imaginary portions of v(kM, q).

7. A frequency multiplex circuit as defined in claim 1 wherein there are a plurality of said digital banks connected to one another in successive stages in an outwardly branching tree structure such that, starting with the first stage, the frequency multiplexed signal is separated into $L_v$ individual signals at the vth stage, where $v = 1, 2 \ldots$, and the sampling rate is reduced at the vth stage by $M_v \leq L_v$.

8. A frequency multiplex circuit as defined in claim 1 further comprising a filter having complex coefficients for sampling an initial frequency multiplexed signal at a sampling rate of $2f_A$ to form the signal s(k).

9. In a frequency multiplex circuit including a digital filter bank for effecting conversion between a frequency multiplexed signal and a plurality of weighted filter signals, and discrete Fourier transformation means connected to said filter bank for effecting a discrete Fourier transformation between the weighted filter signals and 4 individual complex signals appearing on separate lines, wherein:

the frequency multiplexed signal contains component signals each associated with a respective individual complex signal and having a bandwidth B;

the weighted filter signals are complex signals having the form $$v(k,q) = \sum_{p=-\infty}^{+\infty} s(k - i) \cdot h(i) \cdot e^{j\pi i/4}$$

$i = 4p + q$ $q = 0, 1, 2, 3$, and
i, p, $q = (0, 1, 2, 3, \ldots)$ the frequency multiplexed signal is s(k) and has a sampling rate of $f_A$;

h(i) is a coefficient representing a pulse response of a finite length for $i = 0, 1, 2 \ldots N - 1$, which pulse response has a complex rotation factor, where $N = 8\mu - 1$ and $\mu = 1, 2, 3 \ldots$)

the discrete Fourier transformation has the form $$s_l(kM) = \sum_{q=0}^{L-1} v(kM,q) \cdot e^{j\pi ql/2} = DFT\{v(kM,q)\},$$

where $s_l(kM)$ represents the individual complex signals and DFT { } is the discrete Fourier transformation, $M = 2$ and the discrete Fourier transformation involves sampling with respect to every 2nd value of the weighted filter signals;

each component signal of the frequency multiplexed signal is associated with a respective channel having a channel number, l, and a center channel frequency $f_l = l \cdot B + B/2$ and $l = 0, 1, 2, 3$, the improvement wherein:

the frequency multiplexed signal is a complex signal, $s(kT) = s_r(kT) + j s_i(kT)$ with a real portion $Re = s_r(kT)$ and an imaginary portion $Im = s_i(kT)$, and k is a time factor $= \ldots, -1, 0, +1 \ldots$; and said filter bank comprises, for each portion of the frequency multiplex signal;

first delay means consisting of a chain of $(N-1)/2$ delay members each having a delay of $2T = 2f_A$, second delay means consisting of one delay member having a delay of $T(N-3)/2$; and switch means for deriving samples of the associated complex signal portion at the sampling rate of $f_A$ and supplying successive samples to alternate ones of said delay means; said first delay means having $(N+1)/2$ successively numbered output points, the first output point being at the input of the first delay member in said chain, connected to said switch means, and each succeeding output point being at the output of each succeeding delay member of said chain, starting with the first delay member;

first multiplying means connected for multiplying the signals at the odd numbered output points by the $\sqrt{2}$ scaled coefficients h(4a), where $a = 0, 1, 2 \ldots$, and combining the multiplied signals to form a product sum $v_r(0)$ for the real portion or $v_i(0)$ for the imaginary portion;

second multiplying means connected for multiplying the signals at the even numbered output points by the $\sqrt{2}$ scaled coefficients $h(4a+2)$, and combining the multiplied signals to form a product sum $-v_r(2)$ for the real portion or $v_i(2)$ for the imaginary portion;

wherein said first and second multiplying means are operative for causing the multiplied signals associated with each alternate pair of successive output points, starting with the first output point, to be evaluated as positive and for causing the multiplied signals associated with the intervening pairs of successive output points to be evaluated as negative; and third multiplying means connected for multiplying the output of one delay member of said second delay means by $\frac{1}{2}$; and said filter bank further comprises arithmetic means connected to said third multiplying means for each portion of the frequency multiplexed signal for forming a signal $v_i(3)$ representing the sum of the signals produced by the two said third multiplying means and a signal $v_r(3)$ representing the signals produced said third multiplying means associated with the real portion less the signal produced by said third multiplying means associated with the imaginary portion; and said discrete Fourier transformation means are connected to receive the signals $v_r(0)$, $v_1(0)$, $-v_r(2)$, $v_i(2)$, $v_r(3)$ and $v_1(3)$ as complex signals and to form four complex signals $s_0(2k) \ldots s_3(2k)$ having the following relationships:

$$s_{0r}(2k) = v_r(0) + v_r(2) + v_r(3),$$

$$s_{0i}(2k) = v_i(0) + v_i(2) + v_i(3),$$

$$s_{1r}(2k) = v_r(0) - v_r(2) + v_i(3),$$

$$s_{1i}(2k) = v_i(0) - v_i(2) - v_r(3),$$

$$s_{2r}(2k) = v_r(0) + v_r(2) - v_r(3),$$

$$s_{2i}(2k) = v_i(0) + v_i(2) - v_i(3),$$

$$s_{3r}(2k) = v_r(0) - v_r(2) - v_i(3), \text{ and}$$

$$s_{3i}(2k) = v_i(0) - v_i(2) + v_r(3).$$

10. In a frequency multiplex circuit including a digital filter bank for effecting conversion between a frequency multiplexed signal and a plurality of weighted filter signals, and discrete Fourier transformation means connected to said filter bank for effecting a discrete Fourier transformation between the weighted filter signals and 4 individual complex signals appearing on separate lines, wherein:

the frequency multiplexed signal contains component signals each associated with a respective individual complex signal and having a bandwidth B;
the weighted filter signals are complex signals having the form $$v(k,q) = \sum_{p=-\infty}^{+\infty} s(k-i) \cdot h(i) \cdot e^{j\pi i/4}$$

$i = 4p + q$ $q = 0, 1, 2, 3$, and
$i, p, q = (0, 1, 2, 3, \ldots)$
the frequency multiplexed signal is $s(k)$ and has a sampling rate of $f_A$;
$h(i)$ is a coefficient representing a pulse response of a finite length for $i = 0, 1, 2 \ldots N-1$, which pulse response has a complex rotation factor, where $N = 8\mu + 3$ and $\mu = 1, 2, 3 \ldots$)
the discrete Fourier transformation has the form $$s_l(kM) = \sum_{q=0}^{L-1} v(kM,q) \cdot e^{j\pi q l/2} = DFT\{v(kM,q)\},$$

where $s_l(kM)$ represents the individual complex signals and DFT { } is the discrete Fourier transformation, $M = 2$ and the discrete Fourier transformation involves sampling with respect to every 2nd value of the weighted filter signals;
each component signal of the frequency multiplexed signal is associated with a respective channel having a channel number, l, and a center channel frequency $f_l = l \cdot B + B/2$ and $l = 0, 1, 2, 3$, the improvement wherein:

the frequency multiplexed signal is a complex signal, $s(kT) = s_r(kT) + js_i(kT)$ with a real portion $Re = s_r(kT)$ and an imaginary portion $Im = s_i(kT)$, and k is a time factor = $\ldots, -1, 0, +1 \ldots$; and said filter bank comprises, for each portion of the frequency multiplex signal:

first delay means consisting of a chain of $(N-1)/2$ delay members each having a delay of $2T = 2f_A$, second delay means consisting of one delay member having a delay of $T(N-3)/2$; and switch means for deriving samples of the associated complex signal portion at the sampling rate of $f_A$ and supplying successive samples to alternate ones of said delay means; said first delay means having $(N+1)/2$ successively numbered output points, the first output point being at the input of the first delay member in said chain, connected to said switch means, and each succeeding output point being at the output of each succeeding delay member of said chain, starting with the first delay member;

first multiplying means connected for multiplying the signals at the odd numbered output points by the $\sqrt{2}$ scaled coefficients $h(4a)$, where $a = 0, 1, 2 \ldots$, and combining the multiplied signals to form a product sum $v_r(0)$ for the real portion or $v_i(0)$ for the imaginary portion;

second multiplying means connected for multiplying the signals at the even numbered output points by the $\sqrt{2}$ scaled coefficients $h(4a+2)$, and combining the multiplied signals to form a product sum $-v_r(2)$ for the real portion or $v_i(2)$ for the imaginary portion;

wherein said first and second multiplying means are operative for causing the multiplied signals associated with each alternate pair of successive output points, starting with the first output point, to be evaluated as positive and for causing the multiplied signals associated with the intervening pairs of successive output points to be evaluated as negative; and third multiplying means connected for multiplying the output of one delay member of said second delay means by ½; and said filter bank further comprises arithmetic means connected to said third multiplying means for each portion of the frequency multiplex signal for forming a signal $v_i(1)$ representing the sum of the signals produced by the two said third multiplying means and a signal $v_r(1)$ representing the signals produced said third multiplying means associated with the real portion less the signal produced by said third multiplying means associated with the imaginary portion; and said discrete Fourier transformation means are connected to receive the signals $v_r(0)$, $v_1(0)$, $-v_r(1)$, $-v_i(1)$, $-v_r(2)$ and $v_1(2)$ as complex signals and to form four complex signals $s_0(2k) \ldots s_3(2k)$ having the following relationships:

$$s_{0r}(2k) = v_r(0) + v_r(1) + v_r(2),$$

$$s_{0i}(2k) = v_i(0) + v_i(1) + v_i(2),$$

$$s_{1r}(2k) = v_r(0) - v_i(1) - v_r(2),$$

$$s_{1i}(2k) = v_i(0) + v_r(1) - v_i(2),$$

$$s_{2r}(2k) = v_r(0) - v_r(1) + v_r(2),$$

$s_{2i}(2k) = v_i(0) - v_i(1) + v_i(2),$ $s_{3r}(2k) + v_r(0) + v_r(1) - v_r(2),$ and $s_{3i}(2k) = v_i(0) - v_i(1) - v_i(2).$ 11. A frequency multiplex circuit as defined in claim 1 for combining the L individual complex signals to form the frequency multiplexed signal, wherein, said discrete Fourier transformation means is an inverse discrete Fourier transformation device operative for sampling each individual complex signal at a sampling rate of $f_A/M$, and said Fourier transformation device is connected for supplying signals corresponding to the indiviual complex signals to said filter bank.

* * * * *